(12) United States Patent
Happ et al.

(10) Patent No.: US 9,917,222 B2
(45) Date of Patent: Mar. 13, 2018

(54) FRAMELESS SOLAR MODULE WITH MOUNTING HOLES

(71) Applicant: SAINT-GOBAIN GLASS FRANCE, Courbevoie (FR)

(72) Inventors: Thomas Happ, Munich (DE); Jan Boris Philipp, Munich (DE)

(73) Assignee: BENGBU DESIGN & RESEARCH INSTITUTE FOR GLASS INDUSTRY, Bengbu (Anhui) (CN)

( * ) Notice: Subject to any disclaimer, the term of this patent is extended or adjusted under 35 U.S.C. 154(b) by 564 days.

(21) Appl. No.: 14/239,994

(22) PCT Filed: Sep. 28, 2012

(86) PCT No.: PCT/EP2012/069295
§ 371 (c)(1),
(2) Date: Feb. 20, 2014

(87) PCT Pub. No.: WO2013/045683
PCT Pub. Date: Apr. 4, 2013

(65) Prior Publication Data
US 2014/0216527 A1    Aug. 7, 2014

(30) Foreign Application Priority Data

Sep. 30, 2011    (EP) .................... 11183427

(51) Int. Cl.
*H01L 31/042*    (2014.01)
*H01L 31/00*    (2006.01)
(Continued)

(52) U.S. Cl.
CPC ........ *H01L 31/0422* (2013.01); *F24J 2/5252* (2013.01); *H01L 31/18* (2013.01);
(Continued)

(58) Field of Classification Search
CPC .......... H02S 40/32; H02S 20/00; H02S 30/10; H01L 31/18; F24J 2/5252; Y02E 10/47; Y02B 10/12
(Continued)

(56) References Cited

U.S. PATENT DOCUMENTS

| | | | |
|---|---|---|---|
| 5,217,540 A * | 6/1993 | Ogura | ........... H01L 31/048 136/251 |
| 2010/0108118 A1 * | 5/2010 | Luch | ........... F24J 2/525 136/244 |
| 2011/0146763 A1 | 6/2011 | Sagayama | |

FOREIGN PATENT DOCUMENTS

| | | |
|---|---|---|
| CN | 201593276 U | 9/2010 |
| CN | 102136504 | 7/2011 |

(Continued)

OTHER PUBLICATIONS

English machine translation of CN 102136504 A.*
(Continued)

*Primary Examiner* — Angelo Trivisonno
(74) *Attorney, Agent, or Firm* — Steinfl + Bruno LLP

(57) ABSTRACT

A frameless solar module having a carrier substrate and a top layer connected thereto, between which there is a layer structure which forms a plurality of solar cells connected in series for the photovoltaic generation of power is described. The carrier substrate and/or the top layer of the frameless solar module is/are provided with mounting holes for mounting the solar module on a module bracket or for connection to at least one further solar module. The mounting holes are produced in a coating-free zone within a photovoltaically active region. Mounting arrangements having such a solar module which contain fixing elements which pass through the mounting holes are also described. Furthermore, a method for producing such a solar module in
(Continued)

which the mounting holes are produced in the carrier substrate and/or in the top layer is also described.

15 Claims, 7 Drawing Sheets

(51) Int. Cl.
  *H01L 21/00* (2006.01)
  *F24J 2/52* (2006.01)
  *H01L 31/18* (2006.01)
  *H02S 20/00* (2014.01)
  *H02S 30/10* (2014.01)
  *H02S 40/32* (2014.01)

(52) U.S. Cl.
  CPC .............. *H02S 20/00* (2013.01); *H02S 30/10* (2014.12); *H02S 40/32* (2014.12); *Y02B 10/12* (2013.01); *Y02E 10/47* (2013.01)

(58) Field of Classification Search
  USPC .................................................. 136/244, 251
  See application file for complete search history.

(56) References Cited

FOREIGN PATENT DOCUMENTS

| | | | |
|---|---|---|---|
| CN | 102136504 A | * | 7/2011 |
| DE | 4324318 | | 1/1995 |
| DE | 4331425 | | 3/1995 |
| DE | 202008008743 | | 7/2008 |
| DE | 202008013819 | | 3/2009 |
| EP | 0525225 | | 2/1993 |
| EP | 2200097 | | 6/2010 |
| JP | H0410481 A | | 1/1992 |
| JP | H0579960 A | | 3/1993 |
| JP | H06318729 A | | 11/1994 |
| JP | H09250220 A | | 9/1997 |
| JP | H11200575 A | | 7/1999 |
| JP | 2001152593 A | | 6/2001 |
| JP | 2001203380 A | | 7/2001 |
| JP | 2003133573 A | | 5/2003 |
| JP | 2005226358 A | | 8/2005 |
| JP | 2010283229 A | | 12/2010 |
| KR | 1020110087023 A | | 8/2011 |

OTHER PUBLICATIONS

PCT Written Opinion dated Dec. 3, 2012 for PCT/EP2012/069295 filed on Sep. 28, 2012 in the name of Saint-Gobain Glass France (English and German).

PCT International Search Report dated Dec. 3, 2012 for PCT/EP2012/069295 filed on Sep. 28, 2012 in the name of Saint-Gobain Glass France.

* cited by examiner

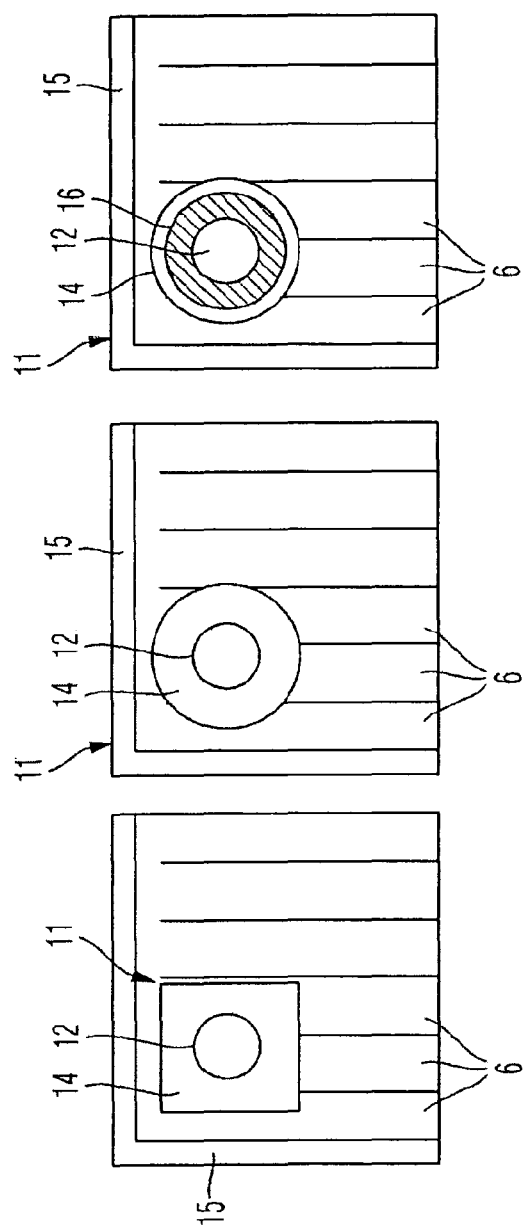

FRAMELESS SOLAR MODULE WITH MOUNTING HOLES

CROSS REFERENCE TO RELATED APPLICATIONS

The present application is the US national stage of International Patent Application PCT/EP2012/069295 filed on Sep. 28, 2012 which, in turn, claims priority to European Patent Application EP 11183427.1 filed on Sep. 30, 2011.

Photovoltaic layer systems for the direct conversion of sunlight into electrical energy are well known. They are commonly referred to as "solar cells", with the term "thin-film solar cells" referring to layer systems with small thicknesses of only a few microns that require carrier substrates for adequate mechanical stability. Known carrier substrates include inorganic glass, plastics (polymers), or metals, in particular metal alloys, and can, depending on the respective layer thickness and the specific material properties, be designed as rigid plates or flexible films.

In view of the technological handling quality and efficiency, thin-film solar cells with a semiconductor layer of amorphous, micromorphous, or polycrystalline silicon, cadmium telluride (CdTe), gallium-arsenide (GaAs), or a chalcopyrite compound, in particular copper-indium/gallium-disulfur/diselenide, abbreviated by the formula $Cu(In,Ga)(S,Se)_2$, have proved advantageous. In particular, copper-indium-diselenide ($CuInSe_2$ or CIS) is distinguished by a particularly high absorption coefficient due to its band gap adapted to the spectrum of sunlight.

Typically, with individual solar cells, it is only possible to obtain voltage levels of less than 1 volt. In order to obtain a technically useful output voltage, many solar cells are connected to one another serially in a solar module. For this, thin-film solar modules offer the particular advantage that the solar cells can already be serially connected in an integrated form during production of the films. Thin-film solar modules have already been described many times in the patent literature. Reference is made merely by way of example to the printed publications DE 4324318 C1 and EP 2200097 A1.

In the so-called "substrate configuration", for the production of the solar cells, the various layers are applied directly onto a carrier substrate that is adhered ("laminated") to a front transparent cover layer to form a weather resistant composite.

In practice, solar modules are mounted on the roofs of buildings ("on-roof mounting") or form a part of the roof cladding ("in-roof mounting"). It is also common to use solar modules as façade or wall elements, in particular in the form of freestanding or self-supporting (carrier-free) glass structures.

In on-roof mounting, the solar modules are mounted parallel to the roof in a module holder anchored in the roof, with the solar modules attached, for example, to the module holder by module clamps. For this, the solar modules have a module frame, conventionally made of aluminum, on which the solar module can be attached. The module holder usually comprises a mounting rack made of aluminum rails that are attached, for example, by steel anchors on tiled roofs or screws on corrugated sheet roofs or trapezoidal sheet metal roofs. Since, in contrast to in-roof mounting, with on-roof mounting, the roof cladding is completely retained, the solar modules do not have to assume any roof function. With in-roof mounting, a module holder, which is attached to a roof substructure is also used. To ensure leak tightness, the joints between the solar modules must be sealed. In the case of freestanding installation, a support structure on which the solar modules are attached is provided. In the case of self-supporting structures, the solar modules are connected to each other on the module frames.

In recent times, frameless solar modules, which enable reduced module weight and lower production costs, have been increasingly used. For mounting, the solar modules are provided on their back side with a reinforcement brace made of steel or aluminum, which is typically adhesively bonded to the carrier substrate. The frameless solar modules can be attached on a module holder via the reinforcement braces. This type of mounting is relatively complex and susceptible to wear due to the adhesive bonding. Moreover, it permits no aesthetically attractive solution for self-supporting structures.

In contrast, the object of the present invention consists in advantageously improving the conventional mounting of frameless solar modules, by simplifying mounting and reducing mounting costs. In particular, frameless solar modules should be capable of being used even in the form of self-supporting structures. These and other objects are accomplished according to the proposal of the invention by a solar module and mounting arrangements, as well as a method for producing a frameless solar module with the characteristics of the coordinated claims. Advantageous embodiments of the invention are indicated by the characteristics of the subclaims.

According to the invention, a frameless solar module with a carrier substrate and a cover layer connected thereto is presented. Between the carrier substrate and the cover layer is situated a layer structure by which a plurality of serially connected solar cells for photovoltaic energy generation is formed. The carrier substrate and the cover layer are made, for example, of inorganic glass, polymers, or metal alloys and are, depending on layer thickness and material properties, preferably designed as rigid plates.

The solar module is, preferably, a thin-film solar module with thin-film solar cells serially connected in an integrated form. The layer structure comprises a back electrode layer, a front electrode layer, and a semiconductor layer. Preferably, the semiconductor layer is made of a chalcopyrite compound which can be, for example, a I-III-VI semiconductor from the group copper-indium/gallium disulfur/diselenide ($Cu(InGa)(SSE)_2$), for example, copper-indium-diselenide ($CuInSe_2$ or CIS) or related compounds.

It is essential that the carrier substrate and/or the cover layer be, in each case, provided with a plurality of mounting holes for mounting the solar module on a module holder or for connecting to at least one additional solar module. The solar module according to the invention thus particularly advantageously enables a technically less complex, highly versatile, and economical mounting of the solar module on the module holder, as well as an aesthetically attractive connection of solar modules in a self-supporting structure. In particular, the solar modules can be mounted next to each other with a small expansion joint without additional support elements.

The mounting holes are in each case implemented in a coating-free zone within a photovoltaically active region of the solar module. This measure enables selective positioning of the mounting holes for a reliable and secure mounting of the solar module, which, in contrast to the conventional attachment method of framed solar modules, is not limited to the module frames. In addition, it is not necessary to provide a relatively wide, coating-free edge region of the solar module for implementation of the mounting holes such that the area of the carrier substrate available for the production of the solar cells is efficiently usable.

In the solar module according to the invention, the photovoltaically active region is provided with coating-free zones, in which the mounting holes are disposed. Typically, the photovoltaically active region is implemented in the shape of a rectangle. The coating-free zones are implemented as recesses or notches of the photovoltaically active region. Thus, the photovoltaically active region is reduced by the coating-free zones of the solar module.

The solar module has first solar cells and second solar cells (different from the first solar cells), with the second solar cells having in each case a shape that is different from the shape of the first solar cells. The first solar cells are not affected by the coating-free zones, with the first cells being in each case produced from a section of the layer structure in which no coating-free zone is situated. Typically, the solar module has first solar cells identical to each other (having, for example, at the module level, a shape identical to each other, in particular, a rectangular shape).

In addition, the solar module has second solar cells whose shape is modified relative to the shape of the first solar cells due to the coating-free zones. The second solar cells are produced in each case from a section of the layer structure in which at least one coating-free zone is situated. Each second solar cell that has a different shape from a first solar cell. The second solar cells can have a shape identical to each other.

The coating-free zones are, for example, in each case a decoated zone, i.e., a zone, in which the layer structure for the formation of the solar cells has been removed. It is, however, also conceivable that in the coating-free zones, no layer structure is applied, which can be achieved, for example, by masking during application of the layer structure.

It is particularly advantageous here for the solar cells of the solar module serially connected to each other to have, despite the provision of coating-free zones within the photovoltaically active region of the solar module, a cell area identical to each other or the same. In this case, each solar cell has a solar cell area that matches the solar cell area of every other solar cell of the solar module. Anyway, the first solar cells have the same solar cell area due to the shape typically identical to each other. The second solar cells can have a shape identical to each other such that their solar cell areas can also be identical to each other. In any case, the second solar cells have in each case a shape that is different from the shape of the first solar cells, with, in this embodiment, all solar cells (first and second solar cells) of the solar module having a solar cell area identical to each other. Thus, every second solar cell has a solar cell area that matches the solar cell area of a first solar cell. For example, rectangular second solar cells have, in each case, for this purpose, a greater width (shorter dimension) than rectangular first cells, with the length (longer dimension) of the second solar cells shorter in each case than the length of the first solar cells due to the coating-free zones. This measure enables the solar cells to be operated in an at least approx. identical working point of their characteristic curve such that the efficiency of the solar cells affected by the coating-free zones is not degraded relative to the other solar cells.

Preferably, a sealant is disposed between the carrier substrate and the cover layer sealing the mounting hole circumferentially relative to the layer structure, by which means the penetration of moisture and dirt into the photovoltaically active region can be prevented.

In another advantageous embodiment of the frameless solar module according to the invention, the carrier substrate or the cover layer implemented in the form of a rigid cover plate has a protruding edge section in which the mounting holes are implemented. Thus, the carrier substrate has a protruding edge section that protrudes relative to the cover layer. Alternatively, the cover layer has a protruding edge section that protrudes relative to the carrier substrate.

Particularly advantageously, the edge section is formed by the front or light-incident side cover layer, which enables the processing of the solar cells to remain unchanged and the carrier substrate is laminated with the cover layer provided with the mounting holes only in the so-called "back end". In addition, the photovoltaically active area of the solar cell is not negatively affected.

The invention extends further to a mounting arrangement with at least one frameless solar module as described above, wherein the solar module is mounted on the module holder by fastening elements, for example, bolts, passing through the mounting holes. Advantageously, to reduce the mechanical load on the mounting holes, a washer made of an elastically flexible material, for example, rubber, is disposed between the fastening element and the solar module and/or between the solar module and the module holder.

The invention further extends to a mounting arrangement with frameless solar modules as described above, wherein adjacent solar modules are connected to each other by connecting elements that are mounted on the solar modules by fastening elements, for example, bolts, passing through the mounting holes. Advantageously, joints between adjacent solar modules are sealed by sealing elements.

Moreover, the invention extends to a method for producing a frameless solar module, in particular a thin-film solar module, with a carrier substrate and a cover layer connected thereto, between which a layer structure is situated, by which a plurality of serially connected solar cells for photovoltaic energy generation is formed. In the method according to the invention, the carrier substrate and/or the cover layer are provided with mounting holes for mounting the solar module on a module holder or for connecting to at least one additional solar module. From a process technology standpoint, it can be advantageous for the mounting holes to be implemented in the carrier substrate and/or in the cover layer before the application of the layer structures on the carrier substrate. According to the invention, the layer structure is removed in the coating-free zones containing the mounting holes or provided for implementation of the mounting holes, by which means a process technology advantage can likewise be obtained. Preferably, on each mounting hole, a sealant sealing the mounting hole circumferentially relative to the layer structure is disposed between the carrier substrate and the cover layer. Furthermore, it can be advantageous for a sealant to be introduced in each case into the mounting holes.

BRIEF DESCRIPTION OF THE DRAWINGS

The invention is now explained in detail using exemplary embodiments, with reference to the accompanying figures. They depict:

FIG. 2A-2C schematic detail to illustrate the mounting holes of the solar modules of FIG. 1;

DETAILED DESCRIPTION OF THE DRAWINGS

Figure 1:
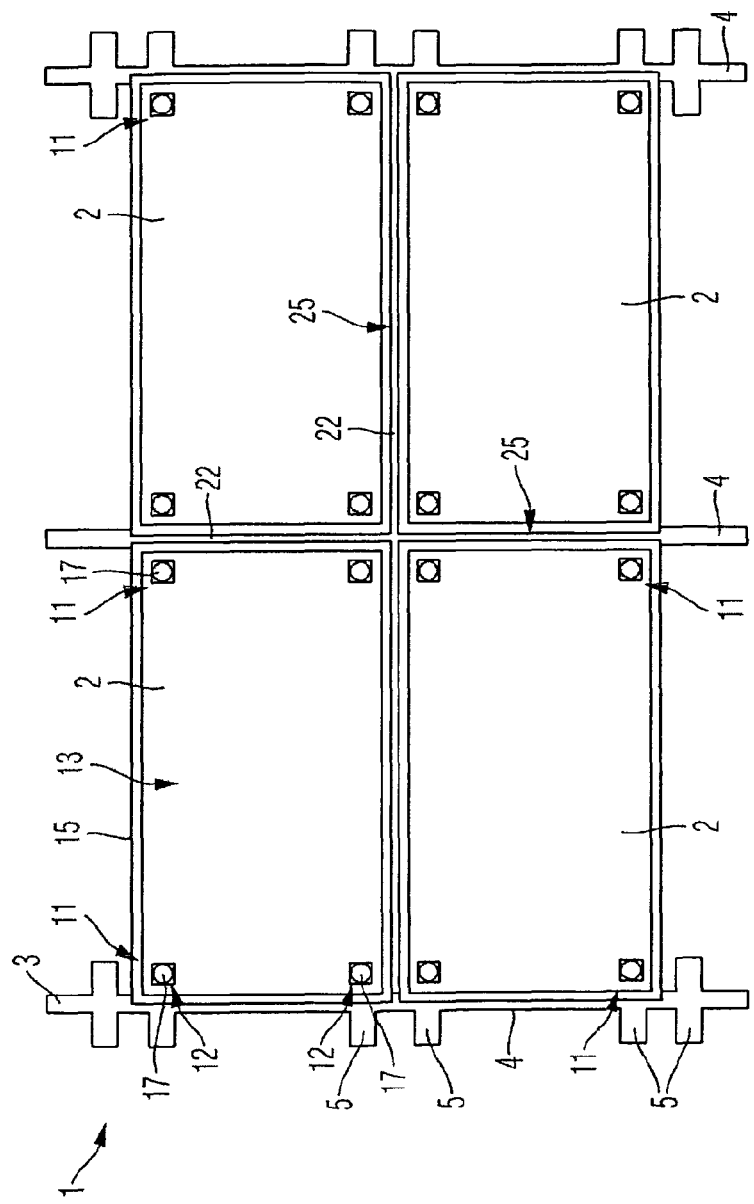
FIG. 1 in a schematic top view, a mounting arrangement according to the invention for on-roof or in-roof mounting of solar modules.

Reference is first made to FIGS. 1, 2A-2C, and 3A-3B. FIG. 1 illustrates the structure of a mounting arrangement 1, referred to as a whole by the reference character 1, in which a plurality of solar modules 2, which are here, for example, thin-film solar modules, is mounted on a module holder 3. Although four solar modules 2 are depicted in FIG. 1, it is understood that the mounting arrangement 1 can likewise hold a larger or smaller number of solar modules 2. The solar modules 2 are, as is customary, in each case implemented as flat bodies with a rectangular shape.

The module holder 3 serves for on-roof or in-roof mounting of the solar modules 2 and comprises a plurality of parallel support rails 4, which are made, for example, of aluminum. The support rails 4 are, for example, anchored by screws or steel anchors to a building roof (not shown) (in on-roof mounting) or to a roof substructure (in in-roof mounting). Each support rail 4 has a plurality of module brackets 5, which are disposed perpendicular to the support rail 4 distributed along the length of the rails and serve for mounting the solar modules 5 [sic: 2].

As discernible in FIG. 2A-2C, the solar modules 2 include in each case a plurality of solar cells 6 with a rectangular solar cell area serially connected to each other in an integrated form. Each solar module 2 has, as a rule, a large number (e.g., approx. 100) solar cells 6.

Figure 3A:
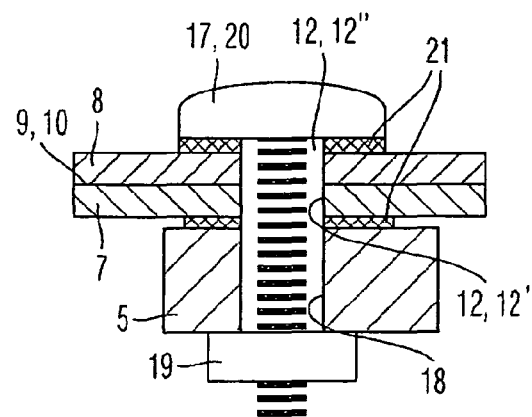
FIG. 3A-3B schematic cross-sectional views in the region of the mounting holes to illustrate the mounting of the solar modules of FIG. 1.
Figure 3B:
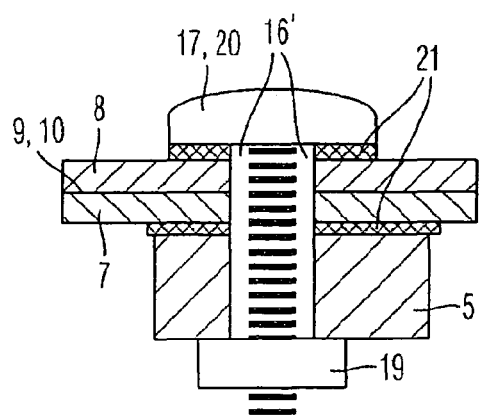

As indicated in FIG. 3A-3B, the solar modules 2 are based here, for example, on the so-called "substrate configuration" and include an electrically insulating, back carrier substrate 7 with a layer structure 9 applied thereon to form the solar cells 6, as well as a front- or light-incident side cover plate 8, which is connected to the carrier substrate 7. The rigid carrier substrate 7 with the structured layer structure 9 is adhered ("laminated") to the rigid cover plate 8 by an adhesive layer 10, which contains, for example, polyvinyl-butyral (PVB) or ethylene vinyl acetate (EVA).

The layer structure 9 (not depicted in detail) comprises a back electrode layer disposed on the front side of the carrier substrate 7, made from a light-impermeable metal, for example, molybdenum, a photovoltaically active absorber layer deposited on the back electrode layer, which includes, for example, a p-conductive chalcopyrite semiconductor, such as a compound of the group copper-indium-diselenide ($CuInSe_2$), in particular sodium (Na)-doped $Cu(In,Ga)(S, Se)_2$, a buffer layer, and a front electrode layer applied on the buffer layer, which is transparent to radiation in the spectral range sensitive for the semiconductor, and is based, for example, on a doped metal oxide, for example, n-conductive, aluminum-doped zinc oxide. The layer structure 9 is divided in methods known per se into the solar cells 6, with the division occurring by incisions with the use of a suitable structuring technology such as laser writing. Since the basic structure of such a solar module 2 with serially connected solar cells 6 is known per se to the person skilled in the art, it is not discussed in greater detail here.

The rigid carrier substrate 7 is made here, for example, from glass with relatively low light transmittance, with it equally possible to use other insulating materials with sufficient strength as well as inert behavior relative to the process steps performed. The rigid cover plate 8 contains, for example, tempered, extra white glass with low iron content.

The solar modules 2 are provided in their corner regions 11 in each case with a mounting hole 12 implemented in the form of a perforation, with the mounting holes 12 implemented within a photovoltaically active region 13 of the solar cells 6. In each case, around the mounting holes 12, a coating-free zone 14 (recess or notch of the layer structure 9) is implemented, in which, accordingly, no layer structure 9 is situated. As depicted in FIGS. 2A and 2B, the coating-free zones 14 can, for example, have a rectangular or round shape. As depicted in FIG. 2C, preferably, a sealant 16, made, for example, from butyl rubber, is disposed around the mounting holes 12 between the carrier substrate 7 and the cover plate 8, by which means a circumferential edge seal of the mounting holes 12 can be achieved.

In a preferred method of manufacture of the solar module 2, the layer structure 9 is applied on the carrier substrate 7 already provided with pre-drilled mounting holes 12' and the carrier substrate 7 is then laminated with the cover plate 8 already provided with pre-drilled mounting holes 12". The mounting holes 12' of the carrier substrate 7 are disposed in alignment with the mounting holes 12' of the cover plate 8. Before lamination, the layer structure 9 is removed in the coating-free zones 14, for example, mechanically abrasively by means of a friction wheel. The decoating occurs advantageously together with an edge decoating of an edge zone 15 of the solar module 2. In addition, the sealant 16 is disposed around the mounting holes 12, which is advantageously made of a material that melts during lamination to form an edge seal of the mounting holes 12 after solidification.

In an alternative method of manufacture, the mounting holes 12 are produced after the fact in the laminated solar module 2, for example, by laser drilling. Advantageously, the coating-free zones 14 are decoated before lamination and the sealant 16 is disposed in the region of the mounting holes 12 to be produced.

It is also conceivable to implement the coating-free zones 14 not by after-the-fact decoating but rather by masking during the application of the layer structure 9 on the carrier substrate 7.

FIG. 3A-3B illustrate the mounting of a solar module 2 on a module bracket 5 by means of a bolt connection. The module bracket 5 is provided, for this purpose, with a holder hole 18 that is disposed in alignment with the mounting hole 12. For mounting, a bolt 17 passing through the mounting hole 12 and the holder hole 18 is brought into position, which bolt is screwed together with a locknut 19. The bolt 17 rests with its bolt head 20 against the front side of the solar module 2; the solar module 2 rests with its back side against the module bracket 5. Locally excessive mechanical stresses can be prevented by washers 21 made of an elastic material, for example, rubber, between the bolt head 20 and the solar module 2 as well as between the solar module 2 and the module bracket 5. As depicted in FIG. 3B, a sealant 16' can be introduced into the mounting holes 12 before the insertion of the bolt 17 in order to achieve additional sealing of the mounting holes. Optionally, it is possible to dispense with the edge sealing by the sealant 16 between the carrier substrate 7 and the cover plate 8.

As depicted in FIG. 1, in the mounting arrangement 1, the solar modules 2 are disposed next to each other along two orthogonal spatial directions, with a joint 25 remaining in each case between adjacent solar modules 2. In each case, a sealing strip 22, made, for example, of rubber, is introduced into the joints 25, by which means, in particular with an in-roof mounting, the leak tightness can be ensured. The sealing strip 22 can also be, for example, a façade element.

Figure 4A:
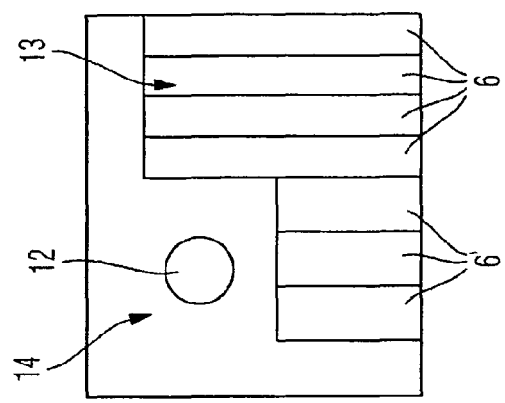
FIG. 4A-4B schematic top views to illustrate solar cells of equal solar cell area in the solar modules of FIG. 1.

FIG. 4A is now considered. As is discernible from statements above, the mounting holes 12 are implemented in the solar modules 2 in the photovoltaically active region 13 of the solar cells 6, with the result that, with identical width (along the x-direction), the solar cells 6 have a different solar cell area. Accordingly, by means of a coating-free zone 14, the respective solar cell area of, for example, four solar cells 6' (referred to in the introduction to the description as "second solar cells") is reduced compared to the respective solar cell area of the solar cells 6 adjacent the coating-free zone 14 (referred to in the introduction to the description as "first solar cells"). The (first) solar cells 6 thus have a shape and solar cell area identical to each other. Likewise, the (second) solar cells 6' have a shape and solar cell area identical to each other. However, the shape and solar cell area of a (second) solar cell 6' are different from the shape and solar cell area of a (first) solar cell 6.

Figure 4B:
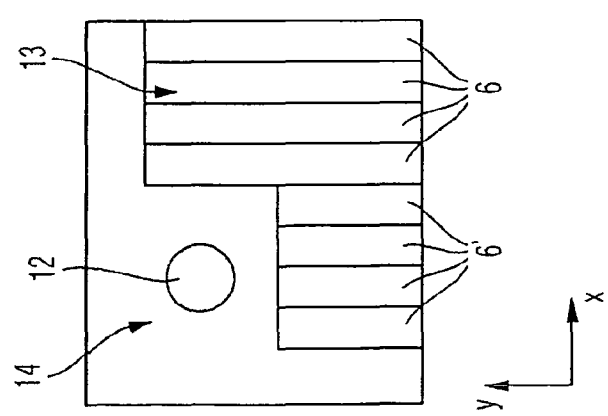

This disadvantageously has the result that the (second) solar cells 6' deliver, on exposure to light, less voltage than the adjacent (first) solar cells 6 and are operated in a different working point of their characteristic curve, such that the efficiency of the solar cells 6' can be reduced. To prevent this, it is advantageous for all solar cells 6, 6' in the solar module 2 to have a solar cell area identical to each other. As illustrated in FIG. 4B, this can be achieved in that the (second) solar cells 6' affected by the coating-free zone 14 in fact have a shorter length (in the y-direction), but a greater width (in the x-direction) than the (first) solar cells 6. Thus, all solar cells 6 can be operated in one and the same, particularly optimal working point of the characteristic curve.

Figure 5:
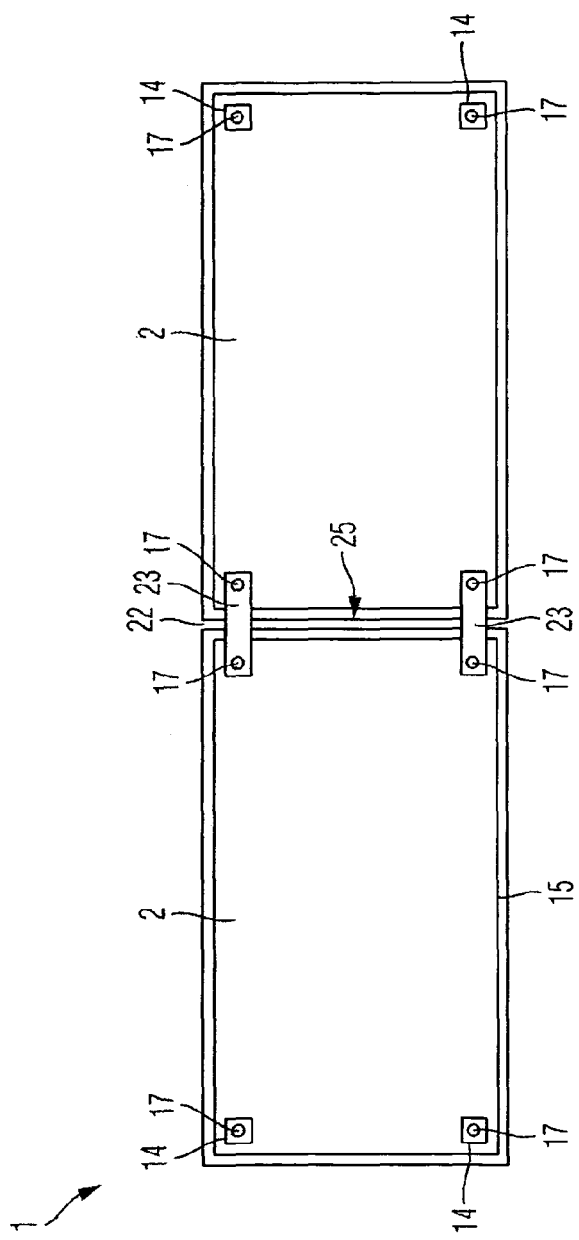
FIG. 5 in a top view, a mounting arrangement according to the invention implemented in the form of a self-supporting structure.
Figure 6A:
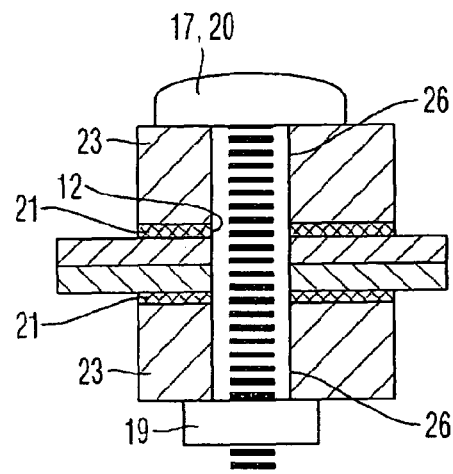
FIG. 6A-6B schematic cross-sectional views in the region of the mounting holes to illustrate the mounting of the solar modules of FIG. 5.
Figure 6B:
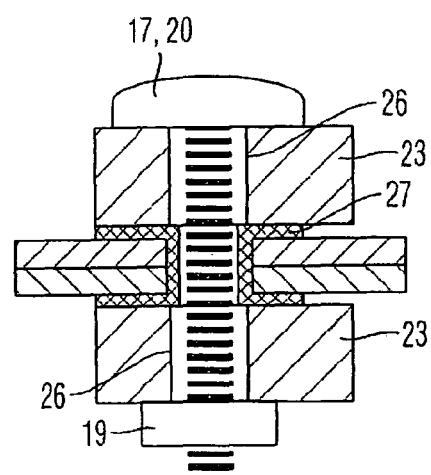

FIGS. 5, 6A, and 6B depict, using a schematic top view and cross-sectional views in the region of the mounting holes 12, the structure of another mounting arrangement 1 according to the invention, which is implemented as a self-supporting structure. In order to avoid unnecessary repetition, only the differences relative to the above mounting arrangement are explained; and, otherwise, reference is made to the statements made there.

In the self-supporting structure, the solar modules 2 are disposed next to each other in a row with a small joint 25. Adjacent solar modules 2 are in each case fixedly connected to each other on their top and bottom by rigid connecting straps 23, with the connecting straps 23, in each case, spanning solar modules 2 adjacent the joints 25. The connecting straps 23 are attached to the solar modules 2 by bolt connections, with the connecting straps 23 equipped, for this purpose, with strap holes 26 that are disposed in alignment with the mounting holes 12. Each mounting hole 12 and the two adjacent strap holes 26 are passed through by a bolt 17, which is tightened with a locknut 19 (cf. FIG. 6A-6B). As depicted in FIG. 6A, a washer 21, made of an elastic material, for example, rubber, is provided in each case between a bolt head 20 and the solar module 2 as well as between the solar module 2 and the module bracket 5. As depicted in FIG. 6B, the two washers 21 can be connected to each other inside the mounting holes 12 and implemented in the form of a sealing piece 27 as a continuous structure lining the mounting hole 12. By means of the sealing piece 27, edge sealing of the mounting hole 12 can be advantageously obtained such that, optionally, edge sealing by a sealant 16 between the carrier substrate 7 and the cover plate 8 can be dispensed with in the region of the mounting hole 12. The connecting straps 23 enable, simply and economically, the construction of an aesthetically attractive, self-supporting structure made of the solar modules 2. A sealing strip 22 is disposed in each case in the joints 25 to ensure the leak tightness of the mounting arrangement 1.

Figure 7A:
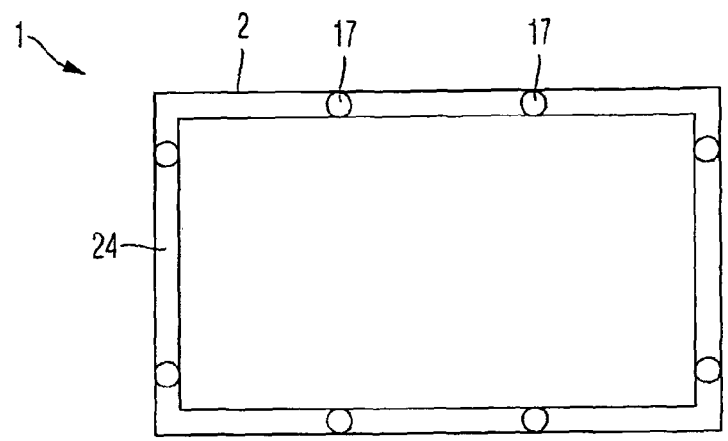
FIG. 7A-7B in a schematic top view and cross-sectional view, another mounting arrangement according to the invention.
Figure 7B:
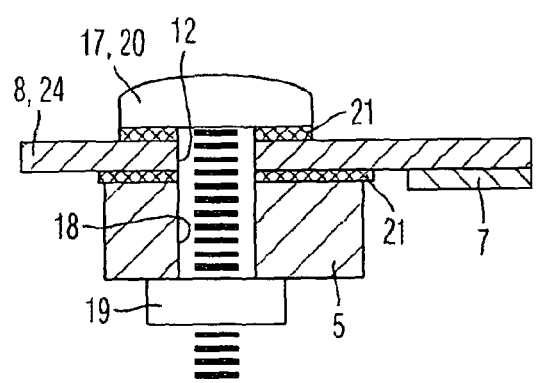

FIG. 7A-7B depict, using a top view and a cross-sectional view in the region of a mounting hole 12, the structure of another mounting arrangement 1 according to the invention, which is equally suitable for on-roof mounting, in-roof mounting, or as a self-supporting structure. In order to avoid unnecessary repetition, only the differences relative to the mounting arrangement 1 illustrated using FIGS. 1, 2A-2C, 3A-3B, and 4A-4B are explained; and, otherwise, reference is made to the statements made there.

Accordingly, the solar module 2 has a cover plate 8, that has a circumferential edge section 24 protruding relative to the carrier substrate 7 and is thus larger than the carrier substrate 8. The mounting holes 12 are implemented distributed only in the protruding edge section 24 of the cover plate 8. This has the advantage that the processing of the solar cells 6 can be carried out in a conventional manner, with only a cover plate 8 with pre-drilled mounting holes 12 for lamination with the carrier substrate 7 having to be provided. It is equally possible to incorporate the mounting holes 12 after the fact in the protruding edge section 24. Decoating in the region of the solar cells 6 is not necessary such that no photovoltaically active area is lost and the production process is simplified. As illustrated in FIG. 7B, bolting to a module bracket 5 or, alternatively, to a connecting strap 23 can take place as in the manner already described. Alternatively, it would also be conceivable to implement the mounting holes 12 in a protruding edge section of the carrier substrate 7.

As emerges from the above description, the invention makes available a frameless solar module, in particular a thin-film solar module, which enables simple, reliable, and economical mounting on a module holder or connection with other solar modules in the form of a self-supporting structure. In particular, identical solar modules can be electively used for on-roof mounting or in-roof mounting or for a self-supporting structure. In addition, a simple and economical replacement of solar modules is enabled. Antitheft protection can be achieved in a simple manner, for example, through the use of carriage bolts or the creation of a non-detachable connection of bolts and locknuts, for example, by welding. When the mounting holes are provided in the photovoltaically active region of the solar modules, module output is, of necessity, somewhat less than with comparable solar modules with conventional backside mounting technology, since solar cell area is utilized. Depending on module size, in a solar module with an area of approx. 66×154 cm, the output loss resulting from four coating-free zones each with a respective area of approx. 4×4 cm amounts to approx. 1-2%. In the case of a solar module in which the mounting holes are implemented in the protruding edge section of the cover plate (or the carrier substrate), no output loss occurs, but a correspondingly larger cover plate (or carrier substrate) must be provided.

The invention relates to a frameless solar module, in particular a thin-film solar module, with a carrier substrate and a cover layer connected thereto, between which a layer structure is situated, by which a plurality of serially connected solar cells for photovoltaic energy generation is formed, wherein the carrier substrate and/or the cover layer is provided with mounting holes for mounting the solar module on a module holder or for connecting to at least one additional solar module.

The invention further relates to a method for producing a frameless solar module, in particular a thin-film solar module, with a carrier substrate and a cover layer connected thereto, between which a layer structure is situated, by which a plurality of serially connected solar cells for photovoltaic energy generation is formed, wherein the carrier substrate and/or the cover layer is provided with mounting holes for mounting the solar module on a module holder or for connecting to at least one additional solar module.

LIST OF REFERENCE CHARACTERS

1 Mounting arrangement
2 Solar module
3 Module holder
4 Support rail
5 Module bracket
6, 6' Solar cell
7 Carrier substrate
8 Cover plate
9 Layer structure
10 Adhesive layer
11 Corner region
12, 12', 12" Mounting hole
13 Active region
14 Coating-free zone
15 Edge zone
16, 16' Sealant
17 Bolt
18 Holder hole
19 Locknut
20 Bolt head
21 Washer
22 Sealing strips
23 Connecting strap
24 Edge section
25 Joint
26 Strap hole
27 Sealing piece

The invention claimed is:
1. A frameless solar module, comprising:
a carrier substrate,
a cover layer connected to the carrier substrate, and
a layer structure which is situated between the carrier substrate and the cover layer, by which a plurality of serially connected solar cells for photovoltaic energy generation is formed,
wherein the carrier substrate and/or the cover layer is provided with mounting holes for mounting the solar module on a module holder or for connecting to at least one additional solar module, and
wherein the mounting holes are implemented in a coating-free zone within a photovoltaically active region,
wherein sides of the coating-free zone are completely surrounded by the photovoltaically active region,
wherein the solar cells comprise rectangular first solar cells and rectangular second solar cells adjacent the coating-free zone,
wherein a length of each of the second solar cells is smaller than a length of each of the first solar cells and a width of each of the second solar cells is greater than a width of each of the first solar cells, and wherein each of the first and second solar cells have an identical solar cell area.

2. The frameless solar module according to claim 1, wherein a sealant is disposed around each mounting hole between the carrier substrate and the cover layer.

3. The frameless solar module according to claim 1, wherein the carrier substrate has an edge section protruding relative to the cover layer or the cover layer has an edge section protruding relative to the carrier substrate, with the mounting holes implemented in the edge section.

4. A mounting arrangement comprising at least one frameless solar module according to claim 1, wherein the solar module is mounted on the module holder by fastening elements, passing through the mounting holes.

5. The mounting arrangement according to claim 4, wherein at each mounting hole, a washer made of an elastically flexible material is disposed between the fastening element and the solar module and/or between the solar module and the module holder.

6. The mounting arrangement with frameless solar modules according to claim 1, wherein adjacent solar modules are connected to each other by connecting elements that are mounted on the solar modules by fastening elements, passing through the mounting holes.

7. The mounting arrangement according to claim 6, wherein joints between adjacent solar modules are sealed by sealing elements.

8. A method for producing a frameless solar module comprising:
connecting a carrier substrate to a cover layer, and
situating a layer structure between the carrier substrate and the cover layer, thereby forming a plurality of serially connected solar cells for photovoltaic energy generation,
wherein the carrier substrate and/or the cover layer is provided with mounting holes for mounting the solar module on a module holder or for connecting to at least one additional solar module,
wherein the layer structure is removed in a coating-free zone containing the mounting holes or provided for implementation of the mounting holes,
wherein sides of the coating-free zone are completely surrounded by a photovoltaically active region,
wherein the solar cells comprise rectangular first solar cells and rectangular second solar cells adjacent the coating-free zone,
wherein a length of each of the second solar cells is smaller than a length of each of the first solar cells and a width of each of the second solar cells is greater than a width of each of the first solar cells, and wherein each of the first and second solar cells have an identical solar cell area.

9. The method according to claim 8, further comprising:
providing the mounting holes in the carrier substrate and/or in the cover layer before applying the layer structure on the carrier substrate.

10. The method according to claim 8, further comprising:
disposing on each mounting hole a sealant sealing the mounting hole circumferentially relative to the layer structure between the carrier substrate and the cover layer.

11. The method according to claim 8, further comprising:
introducing a sealant into each of the mounting holes.

12. The frameless solar module according to claim 1, wherein the frameless solar module is a thin-film solar module.

13. The mounting arrangement according to claim 4, wherein the fastening elements are bolts.

14. The mounting arrangement according to claim 6, wherein the fastening elements are bolts.

15. The method according to claim 8, wherein the frameless solar module is a thin-film solar module.

\* \* \* \* \*